United States Patent
Dudek

(10) Patent No.: US 10,340,394 B2
(45) Date of Patent: Jul. 2, 2019

(54) III-V SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 0 days.

(21) Appl. No.: 15/934,094

(22) Filed: Mar. 23, 2018

(65) Prior Publication Data

US 2018/0277686 A1    Sep. 27, 2018

(30) Foreign Application Priority Data

Mar. 24, 2017   (DE) .................. 10 2017 002 936

(51) Int. Cl.
*H01L 29/861* (2006.01)
*H01L 29/20* (2006.01)
(Continued)

(52) U.S. Cl.
CPC .......... *H01L 29/8613* (2013.01); *H01L 29/20* (2013.01); *H01L 29/32* (2013.01);
(Continued)

(58) Field of Classification Search
CPC ... H01L 33/062; H01L 33/025; H01L 33/002; H01L 29/66136; H01L 29/32; H01L 27/0664

See application file for complete search history.

(56) References Cited

U.S. PATENT DOCUMENTS 3,916,427 A    10/1975  Ying et al.
4,568,889 A *  2/1986  Bayraktaroglu ........ H01L 23/66
                                                  257/604
(Continued)

FOREIGN PATENT DOCUMENTS

CN    103700712 A    4/2014
DE    102014223315 A1    5/2016

OTHER PUBLICATIONS

Ashkinazi, "GaAs Power Devices," ISBN 965-7094-19-4, pp. 8-9 (1999).
(Continued)

*Primary Examiner* — Sonya D. McCall-Shepard
(74) *Attorney, Agent, or Firm* — Muncy, Geissler, Olds & Lowe, P.C.

(57) ABSTRACT

A stacked III-V semiconductor diode having an $n^+$-layer with a dopant concentration of at least $10^{19}$ N/cm$^3$, an $n^-$-layer with a dopant concentration of $10^{12}$-$10^{16}$ N/cm$^3$, a layer thickness of 10-300 microns, a $p^+$-layer with a dopant concentration of $5\times10^{18}$-$5\times10^{20}$ cm$^3$, with a layer thickness greater than 2 microns, wherein said layers follow one another in the sequence mentioned, each comprising a GaAs compound. The $n^+$-layer or the $p^+$-layer is formed as the substrate and a lower side of the $n^-$-layer is materially bonded with an upper side of the $n^+$-layer, and a doped intermediate layer is arranged between the n--layer and the p+-layer and materially bonded with an upper side and a lower side.

13 Claims, 2 Drawing Sheets

(51) Int. Cl.
   *H01L 29/36*   (2006.01)
   *H01L 29/32*   (2006.01)
   *H01L 29/872*  (2006.01)
   *H01L 29/66*   (2006.01)

(52) U.S. Cl.
   CPC ............ H01L 29/36 (2013.01); H01L 29/861 (2013.01); *H01L 29/66204* (2013.01); *H01L 29/872* (2013.01)

(56) References Cited

U.S. PATENT DOCUMENTS

| | | | |
|---|---|---|---|
| 5,119,148 A * | 6/1992 | Anderson | H01L 29/868 257/496 |
| 5,733,815 A | 3/1998 | Ashkinazi et al. | |
| 7,485,920 B2 | 2/2009 | Francis et al. | |
| 9,443,971 B2 | 9/2016 | Haertl et al. | |
| 9,685,504 B2 | 6/2017 | Haertl et al. | |
| 2006/0281263 A1 | 12/2006 | Yamazaki et al. | |

OTHER PUBLICATIONS

F Yu Soldatenkov et al, GaAs-A3B5 heterostructures for high-speed power diodes manufacturing, Journal of Physics:Conference Series 661 (2015) 012066 DOI:10.1088/1742-6596/661/1/012066.
G. Ashkinazi et al, Process and Device Characterization of High Voltage Gallium Arsenide P-i-N. Layers grown by an Improved Liquid Phase Epitaxy Method, Solid-State Electronics vol. 36, No. 12, pp. 1749-1755, 1993.

* cited by examiner

III-V SEMICONDUCTOR DIODE

This nonprovisional application claims priority under 35 U.S.C. § 119(a) to German Patent Application No. 10 2017 002 936.9, which was filed in Germany on Mar. 24, 2017, and which is herein incorporated by reference.

BACKGROUND OF THE INVENTION

Field of the Invention

The invention relates to a III-V semiconductor diode.

Description of the Background Art

From "GaAs Power Devices" by German Ashkinazi, ISBN 965-7094-19-4, page 8 and 9, a high-voltage resistant semiconductor diode $p^+$-n-$n^+$ is known. It is desirable that in addition to the high dielectric strength, high-voltage resistant semiconductor diodes have both a low on-state resistance and low leakage currents in the depletion region.

SUMMARY OF THE INVENTION

It is therefore an object of the invention to provide a device which further develops the prior art.

According to an exemplary embodiment of the invention, a stacked III-V semiconductor diode is provided, comprising an $n^+$-layer, an $n^-$-layer, and a $p^+$-layer.

The $n^+$-layer has an upper side, a lower side, a dopant concentration of at least $10^{19}$ N/cm3 and a layer thickness between 10 microns and 675 microns, preferably between 50 microns and 400 microns, wherein the $n^+$-substrate comprises a GaAs compound or consists of a GaAs compound.

The $n^-$-layer has an upper side, a lower side, a dopant concentration of $10^{12}$-$10^{16}$ N/cm3 and a layer thickness of 10-300 microns, and comprises a GaAs compound or consists of a GaAs compound.

The $p^+$-layer has an upper side, a lower side, a dopant concentration of $5\times10^{18}$-$5\times10^{20}$ N/cm3 and a layer thickness between 0.5 µm and 50 µm and comprises or consists of a GaAs compound.

The layers occur in the mentioned sequence and are monolithic, wherein the $n^+$-layer or the $p^+$-layer is embodied as the substrate and the lower side of the $n^-$-layer is materially connected with the upper side of the $n^+$-layer.

Between the $n^-$-layer and the $p^+$-layer, a doped intermediate layer with a layer thickness of 1-50 microns and a dopant concentration of $10^{12}$-$10^{17}$ cm$^{-3}$ is arranged, with an upper side and a lower side, wherein the lower side of the intermediate layer is materially connected with the upper side of the $n^-$-layer, and the upper side of the intermediate layer is materially connected with the lower side of the $p^+$-layer.

The intermediate layer is materially connected with the $n^-$-layer and with the $p^+$-layer and is p-doped.

The stacked III-V semiconductor diode also comprises a first defect layer. The first defect layer has a layer thickness between 0.5 microns and 40 microns, wherein the defect layer is disposed within the p-doped intermediate layer, and the defect layer has a defect concentration ranging between $1\times10^{14}$ N/cm$^3$ and $5\times10^{17}$ N/cm$^3$. In the following, the terms intermediate layer and p-type layer are used interchangeably.

The layers can be produced by means of liquid phase epitaxy or by means of an MOVPE system.

The defect layer can be generated in different ways, for example by means of implantation or by incorporating impurity atoms, and that a recombination of charge carriers is achieved within the defect layer.

It should also be noted that the defect layer can be not formed within the space charge region. Preferably, the thickness of the p-type layer is formed such that the defect layer is spaced apart from the space charge region.

An advantage is that by means of incorporating the defect layer, the extent of the leakage currents in the depletion region can be reduced, while in the conducting region, the component properties are virtually unaffected. In particular, in the depletion region at a voltage above 1000V, leakage currents have an adverse impact.

Furthermore, the leakage currents strongly increase with the rise in temperature. By incorporating the defect layer, the leakage currents can be reduced by more than an order of magnitude as compared to diodes without defect layers. Furthermore, the manufacturing process becomes much more robust, i.e., resistant to high levels of background doping.

An advantage is that with the III-V semiconductor diode according to the invention, low leakage currents can be easily produced from Si or SiC at reverse voltages ranging from 200V-3300V with smaller on-resistances and lower capacities per area than conventional high-blocking diodes. Thus, switching frequencies of 30 kHz to 0.5 GHz and current densities of 0.5 A/mm$^2$ to 5 A/mm$^2$ can be achieved.

An advantage is that the III-V semiconductor diodes can be produced more cost-effectively than comparable high-blocking diodes made of SiC.

In particular, the III-V semiconductor diodes according to the invention can be used as freewheeling diodes.

It should be noted that the present inventive III-V semiconductor diodes have small on-resistances ranging between 1 mOhm and 200 mOhms. The capacities per area range between 2 pF and 100 pF.

An advantage of the III-V semiconductor diode according to the invention is a high temperature resistance of up to 300° C. In other words, the III-V semiconductor diodes can also be used in hot environments. In this case, low leakage currents due to the exponential increase with increasing temperature are particularly helpful.

In an embodiment, the defect concentration ranges between $1\times10^{13}$ N/cm$^3$ and $5\times10^{16}$ N/cm$^3$. In another embodiment, the thickness of the defect layer is between 0.5 and 40 µm.

In an embodiment, the first defect layer is spaced from the underside of the $p^-$-layer by at least half the layer thickness of the p-type layer.

According to an embodiment, the semiconductor diode has a second defect layer, wherein the second defect layer has a layer thickness ranging between 0.5 microns and 40 microns, preferably ranging between 0.5 and 40 microns and a defect concentration ranging between $1\times10^{13}$ N/cm$^3$ and $5\times10^{16}$ N/cm$^3$, and is spaced from the top of the p-type layer by at most half the layer thickness of the p-type layer. Preferably, the defect concentration of the first defect layer differs from the second defect layer.

In an embodiment, the first defect layer and/or a second defect layer has at least one first layer region with a first defect concentration, and a second layer region with a second defect concentration, and occurs, in particular via the layer thickness of the first defect layer and/or a second defect layer, according to a random, preferably Gaussian, distribution. In other words, the defect concentration varies along the thickness of the defect layer.

According to an embodiment, the first defect layer and/or the second defect layer comprise Cr and/or indium and/or aluminum. Preferably, Cr is incorporated into the n⁻-layer during the epitaxy process. An advantage of incorporating Cr is that by means of the Cr concentration, the number of impurities and thus the number of recombination centers can be set in a cost-effective and simple manner without interrupting the epitaxy process.

In an embodiment, the impurities in the first defect layer and/or in the second defect layer are generated by implanting atoms or molecules or by electron beam irradiation. Preferably, $H_2$ molecules having the appropriate energy and doses are used to generate impurities.

According to an embodiment, a total height of the stacked layer structure composed of the p⁺-layer, the p-doped intermediate layer, the n⁻-layer and the n⁺-layer amounts to between 150-800 microns.

According to an embodiment, the stacked layer structure consisting of the p⁺-layer, the p-doped intermediate layer, the n⁻-layer and the n⁺-layer has a rectangular or square surface with edge lengths between 1 mm and 10 mm, or a round, preferably oval or circular surface.

According to an embodiment, the p⁺-layer of the semiconductor diode is replaced by a connection contact layer, wherein the connection contact layer comprises a metal or a metallic compound or consists of a metal or a metallic compound and forms a Schottky contact.

In an embodiment, the III-V semiconductor diode is monolithic, i.e., the individual monolithically formed layers are likewise monolithic to one another. In another embodiment, the III-V semiconductor diode comprises at least one semiconductor bond.

It is noted that the term semiconductor bond can be used synonymously with the term wafer bond.

In an embodiment, in the stacked layer structure formed of the p+-layer, the p-doped intermediate layer, the n⁻-layer and the n⁺-layer, the semiconductor bond is formed between the n⁻-layer and the p-doped intermediate layer.

In an embodiment, the layer structure formed of a p⁺-layer and the p-doped intermediate layer forms a first partial stack and the layer structure consisting of the n⁺-layer and the n⁻-layer forms a second partial stack.

In an embodiment, the first partial stack is formed in which, starting from a p⁺-layer, the p-doped intermediate layer is produced by means of epitaxy.

The intermediate layer formed as p⁻-layer can have a doping less than $10^{13}$ N/cm$^{-3}$ or a doping between $10^{13}$ N/cm$^{-3}$ and $10^{15}$ N/cm$^{-3}$. In one embodiment, the p⁺-layer is thinned to a thickness of between 200 μm and 500 μm before or after bonding by a grinding process.

In an embodiment, the first partial stack and the second partial stack are each formed monolithically.

In an embodiment, the second stack is formed in which, starting from an n⁻-type substrate, the n⁻-type substrate is connected to the second stack by a further wafer bonding process.

In a further process step, the n⁻-substrate is thinned to the desired thickness. Preferably, the thickness of the n⁻-substrate ranges between 50 microns to 250 microns. Preferably, the doping of the n⁻-type substrate ranges between $10^{13}$ N/cm$^{-3}$ and $10^{15}$ N/cm$^{-3}$.

An advantage of wafer bonding is that thick n⁻-layers can be readily prepared. This eliminates a long epitaxial deposition process. The number of stacking faults in the thick n⁻-layers can also be reduced by means of the bonding.

In an embodiment, prior to bonding, the defect layer is preferably generated by implanting ions into the surface of the first partial stack, i.e., into the p-doped intermediate layer.

In an embodiment, the n⁻-type substrate has a doping greater than $10^{10}$ N/cm$^{-3}$ and less than $10^{13}$ N/cm$^{-3}$. In that the doping is extremely low, the n⁻-substrate can also be considered an intrinsic layer.

In an embodiment, after the n⁻-substrate has been thinned, the n⁺-layer is produced in a range between $10^{18}$ N/cm$^{-3}$ and less than $5\times10^{19}$ N/cm$^{-3}$ by means of epitaxy or high-dose implantation on the n⁻-substrate.

It is understood that the thinning of the n⁻-substrate can be accomplished by means of a CMP step, i.e., via chemical mechanical polishing.

In an embodiment, an auxiliary layer is applied to the front of the diode structure. Subsequently, the back of the diode structure is thinned and deposited on a carrier. In another development, the auxiliary layer is then detached from the front side.

In an embodiment, the surface of the n⁺-substrate and the surface of the p⁺-layer are metallized to electrically connect the semiconductor diode. Preferably, the cathode of the semiconductor diode after metallization is materially connected to a pad formed as a heat sink. In other words, the anode is formed on the surface of the diode on the p⁺-layer.

Different reverse voltages can be achieved with certain combinations of p⁻-interlayers and n⁻-layers.

In a first variant, the: p⁻-intermediate layer has a thickness between 10 microns and 25 microns, and for the n⁻-layer, a thickness between 40 microns and 90 microns results in a blocking voltage of about 900 V.

In a second variant, the: p⁻-intermediate layer has a thickness between 25 μm and 35 μm, and for the n⁻-layer, a thickness between 40 μm and 70 μm results in a blocking voltage of about 1200 V.

In a third variant, the: p⁻-intermediate layer has a thickness between 35 μm and 50 μm, and for the n⁻-layer, a thickness between 70 μm and 150 μm and 70 μm results in a blocking voltage of about 1500 V.

The diodes in the first to third variants can also be referred to as punch-through diodes.

In a fourth variant, the: p⁻-intermediate layer has a thickness between 10 μm and 25 μm, and for the n⁻-layer, a thickness between 60 μm and 110 μm.

In a fifth variant, the: p⁻-intermediate layer has a thickness between 10 μm and 25 μm, and for the n⁻-layer, a thickness between 70 μm and 140 μm.

In a sixth variant, the: p⁻-intermediate layer has a thickness between 35 μm and 50 μm, and for the n⁻-layer, a thickness between 80 μm and 200 μm.

The diodes in the fourth to sixth variants can also be referred to as "non-reach-through" diodes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
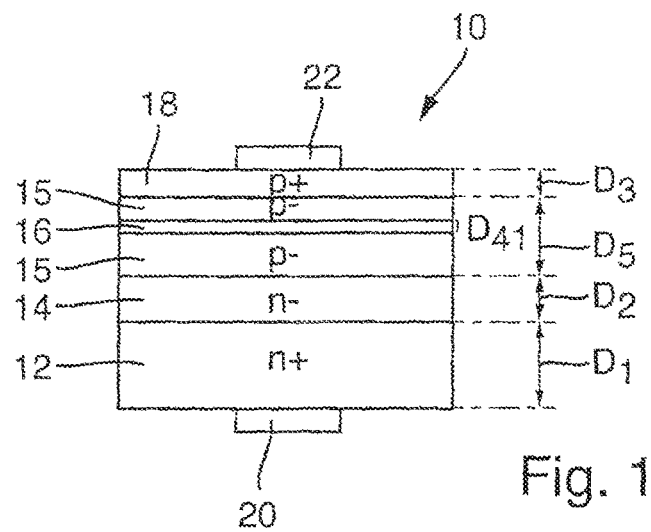
FIG. 1 is a view of an according to the invention of a III-V semiconductor diode.

The illustration of FIG. 1 shows a view of a first embodiment of a stacked III-V semiconductor diode 10 according to the invention, comprising an $n^+$-layer 12 as a substrate, a low doped $n^-$-layer 14 that is cohesively bonded with the $n^+$-layer 12, and a p-doped intermediate layer 15 that is materially bonded to the $n^-$-layer 14, and a $p^+$ layer 18 that is cohesively connected with the intermediate layer, as well as a first contact 20 and a second contact 22. Within the p-type layer 15, a first defect layer 16 is arranged.

The first contact 20 is materially connected with a lower side of the $n^+$-layer 12, while the second contact 22 is materially bonded to an upper side of the $p^+$-layer 18.

The $n^+$-layer 12 is heavily n-doped and has a dopant concentration of $10^{19}$ N/cm$^3$. A layer thickness D1 of the $n^+$-layer 12 is between 100 μm and 675 μm.

The $n^-$-layer 14 is low n-doped with a dopant concentration of $10^{12}$-$10^{16}$ N/cm$^3$ and has a layer thickness D2 of 10-300 microns.

The p-type intermediate layer 15 is low p-doped with a dopant concentration of $10^{12}$-$10^{17}$ N/cm$^3$ and a layer thickness D5 between 1 micron and 50 microns.

The $p^+$-layer 18 is heavily p-doped with a dopant concentration of $10^{19}$ N/cm$^3$ and a layer thickness D3 greater than 2 microns.

The first defect layer 16 has a layer thickness D41 ranging between 0.5 μm and 10 μm and a defect density ranging between $1 \times 10^{13}$ N/cm$^3$ and $5 \times 10^{16}$ N/cm$^3$.

Figure 2:
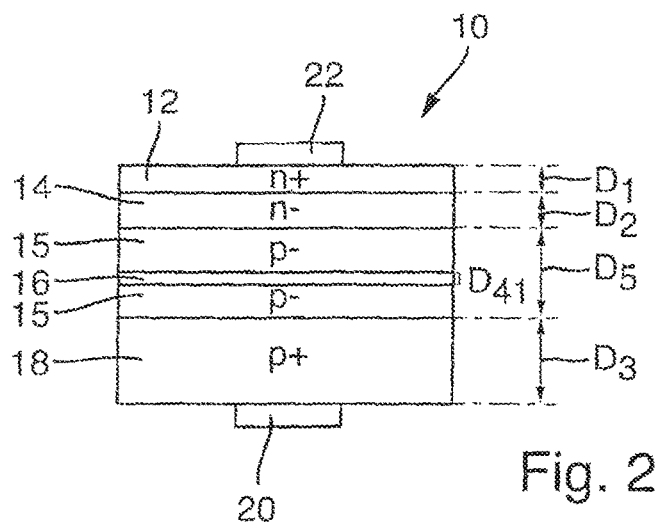
FIG. 2 is a view of an embodiment according to the invention of a III-V semiconductor diode.

The illustrations of FIG. 2 show a second embodiment of a III-V semiconductor diode, wherein the difference to the illustration of FIG. 1 is that the p+-layer 18 is formed as a substrate, followed by the further layers.

Figure 3:
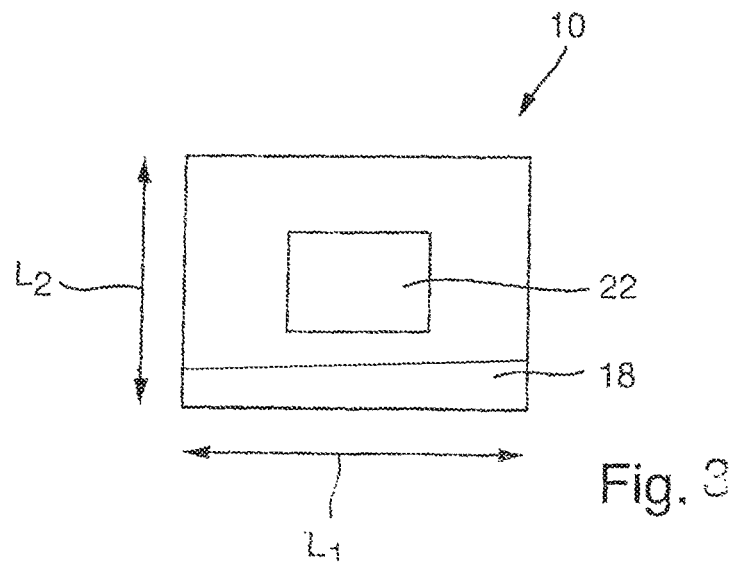
FIG. 3 is a plan view of the III-V semiconductor diode from FIG. 1 or from FIG. 2.

The illustration of FIG. 3 shows a plan view of the first embodiment of an inventive III-V semiconductor diode shown in FIG. 1. In the following, only the differences to the illustration of FIG. 1 are explained.

The stacked layer structure 100 of the III-V semiconductor diode 10, consisting of the $n^+$-substrate 12, the $n^-$-layer 14 comprising the defect layer 16, and the $p^+$-layer 18, has a rectangular circumference and thus also a rectangular surface with the edge lengths L1 and L2. The contact surface 22 disposed on the surface of the layer sequence 100 covers only a part of the surface.

In an embodiment, the corners of the stacked layer structure 100 are rounded to avoid field strength peaks at high voltages.

In an embodiment, the surface of the stacked layer structure 100 is round. As a result, excessive increases in field strength are particularly effectively reduced. Preferably, the surface is circular or oval.

Figure 4:
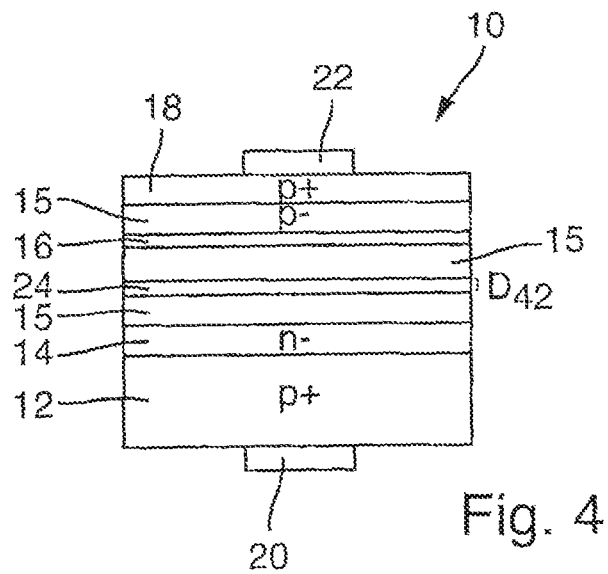
FIG. 4 is a view of an embodiment according to the invention of a III-V semiconductor diode.

The illustration of FIG. 4 shows a development of the III-V semiconductor diode shown in FIG. 1, wherein in contrast to the first embodiment, the p-type intermediate layer 15 of the semiconductor diode 10 has a second defect layer 24 with a thickness D42.

The layer thickness D42 of the second defect layer 24 is between 0.5 microns and 40 microns. The defect concentration is between $1 \times 10^{13}$ N/cm$^3$ and $5 \times 10^{16}$ N/cm$^3$. The distance to the top of the p-type layer is at most half the layer thickness D5 of the intermediate layer.

Figure 5:
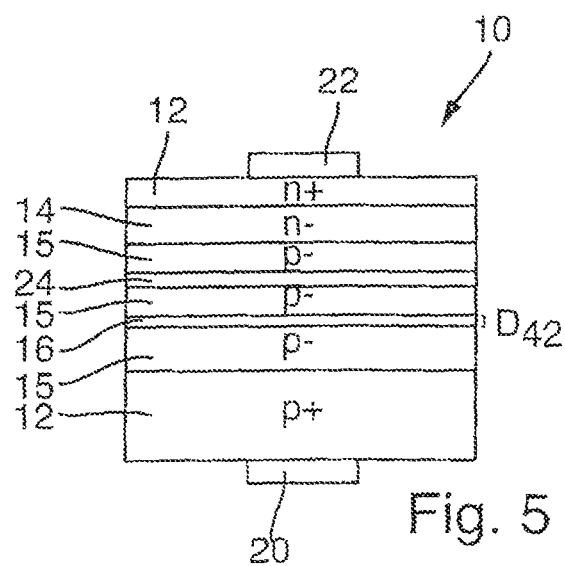
FIG. 5 is a view of an embodiment according to the invention of a III-V semiconductor diode.

The illustrations of FIG. 5 show a development of the III-V semiconductor diode from FIG. 2, wherein the p-type layer 15 of the semiconductor diode 10 has a second defect layer 24 as compared to the second embodiment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked III-V semiconductor diode comprising:
   an $n^+$-layer with an upper side, a lower side, a dopant concentration of at least $10^{19}$ N/cm$^3$ and a layer thickness of about 675 microns or less, wherein said $n^+$-layer comprises a GaAs compound;
   an $n^-$-layer with an upper side and a lower side, a dopant concentration of $10^{12}$-$10^{16}$ N/cm$^3$, a layer thickness of 10-300 microns, and comprising a GaAs compound;
   a $p^+$-layer with an upper side, a lower side, a dopant concentration of $5 \times 10^{18}$-$5 \times 10^{20}$ N/cm$^3$, with a layer thickness greater than 2 microns and comprising a GaAs compound; and
   a p-type intermediate layer with a layer thickness of 1-50 microns and a dopant concentration of $10^{12}$-$10^{17}$ N/cm$^3$ is disposed between the $n^-$-layer and the $p^+$-layer, and is materially bonded with an upper side and a lower side, and the lower side of the p-type intermediate layer is materially bonded with the upper side of the $n^-$-layer, and the upper side of the p-type intermediate layer is materially bonded with the lower side of the $p^+$-layer,
   wherein the $n^+$-layer, the $n^-$-layer, and the $p^+$-layer are monolithically formed,
   wherein the $n^+$-layer or the $p^+$-layer is formed as a substrate and the lower side of the $n^-$-layer is materially connected to the upper side of the $n^+$-layer,
   wherein the p-type intermediate layer is materially bonded with the $n^-$-layer and with the $p^+$-layer and is p-doped,
   wherein the stacked III-V semiconductor diode has a first defect layer with a layer thickness between 0.5 microns and 40 microns,
   wherein the first defect layer is arranged within the p-type intermediate layer, and
   wherein the first defect layer has a first defect concentration ranging between $1 \times 10^{13}$ N/cm$^3$ and $5 \times 10^{16}$ N/cm$^3$.

2. The III-V semiconductor diode according to claim 1, wherein the first defect layer is spaced from the lower side of the p-type intermediate layer by at least half the layer thickness of the p-type intermediate layer.

3. The III-V semiconductor diode according to claim 1, wherein the semiconductor diode has a second defect layer, and
   wherein the second defect layer has a layer thickness between 0.5 microns and 40 microns and a second defect concentration between $1 \times 10^{13}$ N/cm$^3$ and $5 \times 10^{16}$ N/cm$^3$ and is spaced from the upper side of the p-type intermediate layer by not more than half of the layer thickness of the p-type intermediate layer.

4. The III-V semiconductor diode according to claim 1, wherein the semiconductor diode has a second defect layer, and wherein the first defect layer and/or the second defect layer each comprise a first layer region with the first defect concentration and a second layer region with a second defect concentration.

5. The III-V semiconductor diode according to claim 1, wherein the semiconductor diode has a second defect layer, and wherein the first defect concentration over the layer thickness of the first defect layer and/or a second defect concentration over the layer thickness of the second defect layer occurs according to a random distribution.

6. The III-V semiconductor diode according to claim 1, wherein the semiconductor diode has a second defect layer, and wherein the first defect layer and/or the second defect layer comprises Cr and/or indium and/or aluminum.

7. The III-V semiconductor diode according to claim 1, wherein a total height of a stacked layer structure formed of the $p^+$-layer, the $n^-$-layer, the p-type intermediate layer and the $n^+$-layer is at most 150-800 microns.

8. The III-V semiconductor diode according to claim 1, wherein the stacked layer structure formed of the $p^+$-layer, the $n^-$-layer, the p-type intermediate layer and the $n^+$-layer has a rectangular or square surface with edge lengths between 1 mm and 10 mm.

9. The III-V semiconductor diode according to claim 1, wherein the stacked layer structure formed of the $p^+$-layer, the $n^-$-layer, the p-type intermediate layer and the $n^+$-layer has a round or oval or circular surface.

10. The III-V semiconductor diode according to claim 1, wherein the $p^+$-layer of the semiconductor diode is replaced by a connection contact layer, and wherein the connection contact layer comprises a metal or a metallic compound or comprises essentially of a metal or a metallic compound and forms a Schottky contact.

11. The III-V semiconductor diode according to claim 1, wherein the III-V semiconductor diode is monolithic or has a semiconductor bond.

12. The III-V semiconductor diode according to claim 11, wherein the p-type intermediate layer has a $p^-$-layer, and wherein the semiconductor bond is formed between the $p^-$-layer and the $n^-$-layer.

13. The III-V semiconductor diode according to claim 1, wherein n+-layer, the n--layer or the p+-layer comprises essentially of the GaAs compound.

* * * * *